United States Defensive Publication [19] (H) [11] T103,203

Carr et al. [43] Jul. 5, 1983

[54] THIN LAYER DEPOSITION PROCESS

[76] Inventors: Timothy W. Carr, 22 Kimball Dr., Poughkeepsie, N.Y. 12603; Charles D. Needham, Thornacre Rd., Wappingers Falls, N.Y. 12590; Robert T. Villetto, Jr., 12 Hasbrouck Dr., Poughkeepsie, N.Y. 12601

[21] Appl. No.: 408,332

[22] Filed: Aug. 16, 1982

Related U.S. Application Data

[63] Continuation of Ser. No. 106,608, Dec. 26, 1979, abandoned.

[51] Int. Cl.[3] ..... H01L 21/443

[52] U.S. Cl. ..... 427/91; 427/84; 430/315

[57] ABSTRACT

A method of preventing out-gassing from lift-off structures formed of positive resists (as for example, o-quinone diazide/phenol formaldehyde novolak resins) during vacuum evaporation of metals in the fabrication of semiconductor devices. Such outgassing is avoided by compositional control of the photosensitive resist lift-off layer and by providing an additional baking step after the lift-off mask has been formed. Both conditions are required and critical to avoid the volatile resin decomposition products which not only tend to contaminate the device substrate surface, but also the deposited metal film. The method employs a photosensitive polymer which contains about 10 to 20 wt. % of the sensitizer (e.g. o-quinone diazide) in conjunction with a secondary baking step at about 160° to about 200° C. after the lift-off mask has been formed and prior to metal film deposition. As a result the method provides an improved metal film as well as increased through-put, particularly when forming Schottky barrier diode contacts.

8 Claims, 1 Sheet Drawing,

16 Pages Specification

The file of this unexamined application may be inspected and copies thereof may be purchased (849 O.G. 1221, Apr. 9, 1968).

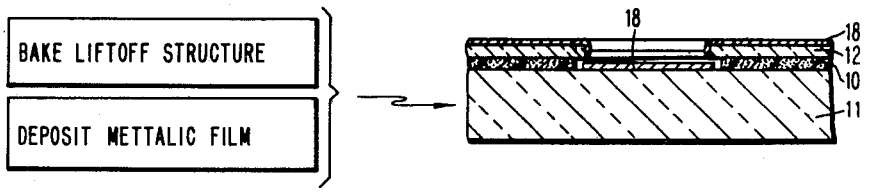

APPLY ORGANIC POLYMERIC RESIST LAYER

BAKE LAYER TO IMPROVE ADHESION AND THERMAL STABILITY

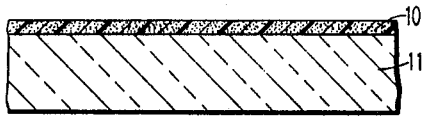

FIG. 1

APPLY POLYDIMETHYLSILOXANE RESIN LAYER

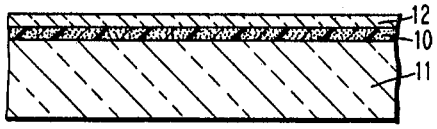

FIG. 2

APPLY SECOND RESIST LAYER

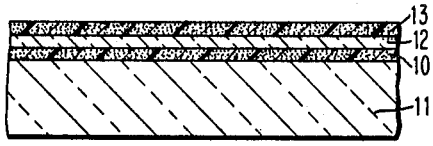

FIG. 3

PATTERN SECOND LAYER TO FORM MASK

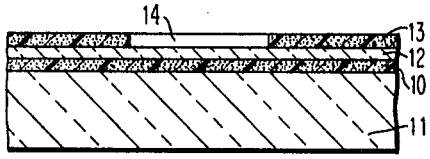

FIG. 4

REACTIVE ION ETCH EXPOSED POLYDIMETHYLSILOXANE RESIN LAYER THROUGH MASK

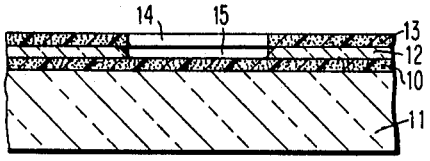

FIG. 5

USING POLYDIMETHYSILOXANE RESIN MASK REACTIVE ION ETCH EXPOSED POLYMERIC LAYER TO FORM LIFTOFF STRUCTURE

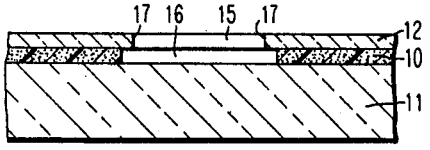

FIG. 6

BAKE LIFTOFF STRUCTURE

DEPOSIT METTALIC FILM

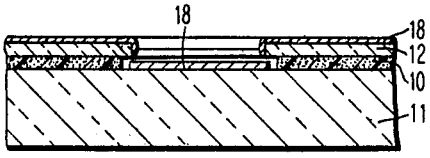

FIG. 7

REMOVING REMAINING POLYMERIC LAYER AND OVERLYING METALLIC

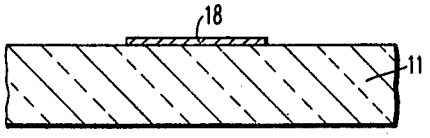

FIG. 8